(12) United States Patent
Montazer

(10) Patent No.: US 9,431,968 B2
(45) Date of Patent: Aug. 30, 2016

(54) METHODS AND APPARATUSES FOR SLEW RATE ENHANCEMENT OF AMPLIFIERS

(71) Applicant: Integrated Device Technology, Inc., San Jose, CA (US)

(72) Inventor: G. Hossein Montazer, San Jose, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 105 days.

(21) Appl. No.: 14/212,741

(22) Filed: Mar. 14, 2014

(65) Prior Publication Data

US 2014/0266449 A1 Sep. 18, 2014

Related U.S. Application Data

(60) Provisional application No. 61/798,594, filed on Mar. 15, 2013.

(51) Int. Cl.
*H03F 3/45* (2006.01)
*H03F 1/02* (2006.01)

(52) U.S. Cl.
CPC ........ *H03F 1/0261* (2013.01); *H03F 3/45192* (2013.01); *H03F 2200/555* (2013.01); *H03F 2203/45248* (2013.01)

(58) Field of Classification Search
CPC ...................................................... H03F 1/0261
USPC ................................ 330/253, 255, 262–264
See application file for complete search history.

(56) References Cited

U.S. PATENT DOCUMENTS

2013/0249639 A1* 9/2013 Lin .................... H03F 3/45192
330/310

\* cited by examiner

*Primary Examiner* — Khanh V Nguyen
*Assistant Examiner* — Khiem Nguyen
(74) *Attorney, Agent, or Firm* — Haynes and Boone LLP

(57) ABSTRACT

A circuit is disclosed to enhance slew rate of an amplifier. An amplifier includes an output, a first input, and a second input in a differential pair configuration. A slew rate enhancer includes a first slew rate enhancer and a second slew rate enhancer. The first slew direction enhancer is configured to detect a first slew rate condition in a first direction responsive to the first input and the second input and provide additional current for a first side of the differential pair of the amplifier during the first slew rate condition. The second slew direction enhancer is configured to detect a second slew rate condition in a second direction responsive to the first input and the second input and provide additional current for a second side of the differential pair of the amplifier during the second slew rate condition.

20 Claims, 4 Drawing Sheets

METHODS AND APPARATUSES FOR SLEW RATE ENHANCEMENT OF AMPLIFIERS

CROSS-REFERENCE TO RELATED APPLICATION

This application claims the benefit of U.S. Provisional Application Ser. No. 61/798,594, filed Mar. 15, 2013, the disclosure of which is hereby incorporated herein in its entirety by this reference.

TECHNICAL FIELD

Embodiments of the present disclosure relate generally to amplifiers and, more particularly, to methods and apparatuses for modifying the slew rate of amplifiers.

BACKGROUND

Differential amplifiers and operational amplifiers are often used in feedback circuits such that under normal operation the amplifier is in a substantially steady state with small differences in voltage between the two inputs.

However, when the inputs are far apart, the amplifier can enter a non-linear mode to rapidly change the output current of the amplifier. The slew rate associated with these changes can cause problems for feedback loops and the feedback loop may enter an unstable state. As a result, improvements to the slew rate of an amplifier can improve the stability characteristics, as well as other characteristic of feedback loops including these amplifiers. Such other characteristics may include clipping and other distortions.

There is a need to enhance the slew rate of an amplifier without affecting other small signal and steady-state characteristics of the amplifier.

BRIEF SUMMARY

Embodiments of the present disclosure enhance the slew rate of an amplifier without affecting other small signal AC characteristics and DC characteristics of the amplifier.

Embodiments of the present disclosure include a circuit to enhance slew rate. The circuit includes an amplifier, a first slew direction enhancer and a second slew direction enhancer. The amplifier includes a positive input operably coupled to a first side of an amplifier differential pair, a negative input operably coupled to a second side of the amplifier differential pair, and an output. The first slew direction enhancer includes a first differential pair operably coupled to the positive input and the negative input, wherein the first differential pair is configured to cause the first slew direction enhancer to provide additional current for the first side of the amplifier differential pair during an offset in a first direction between the positive input and the negative input. The second slew direction enhancer includes a second differential pair operably coupled to the positive input and the negative input, wherein the second differential pair is configured to cause the second slew direction enhancer to provide additional current for the second side of the amplifier differential pair during an offset in a second direction between the positive input and the negative input.

Embodiments of the present disclosure also include a circuit to enhance slew rate including an amplifier comprising a first input and a second input in a differential pair configuration and an output. The circuit also includes a slew rate enhancer including a first slew direction enhancer and a second slew direction enhancer. The first slew direction enhancer is configured to detect a first slew rate condition in a first direction responsive to the first input and the second input. The first slew direction enhancer is also configured to provide additional current for a first side of the differential pair of the amplifier during the first slew rate condition. The second slew direction enhancer is configured to detect a second slew rate condition in a second direction responsive to the first input and the second input. The second slew direction enhancer is also configured to provide additional current for a second side of the differential pair of the amplifier during the second slew rate condition.

Embodiments of the present disclosure also include a method of enhancing slew rate. The method includes detecting a first slew rate condition responsive to a first offset in a first direction between a first input and a second input. Additional current is provided for a first side of a differential pair of an amplifier coupled to the first input and the second input during the first slew rate condition. The method also includes detecting a second slew rate condition responsive to a second offset in a second direction between the first input and the second input. Additional current is provided for a second side of the differential pair of the amplifier during the second slew rate condition.

DETAILED DESCRIPTION

Figure 1:
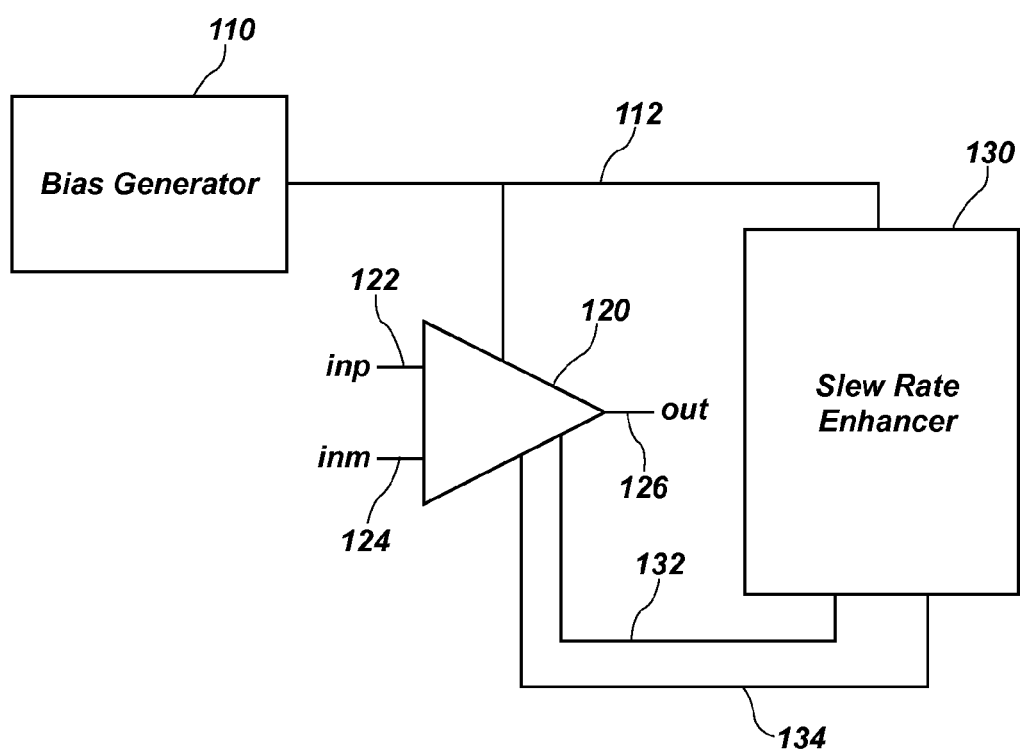
FIG. 1 illustrates a block diagram of a differential amplifier with a slew rate enhancer.

In the following detailed description, reference is made to the accompanying drawings that form a part hereof, and in which is shown by way of illustration, specific embodiments in which the present disclosure may be practiced. These embodiments are described in sufficient detail to enable those of ordinary skill in the art to practice the present disclosure. It should be understood, however, that the detailed description and the specific examples, while indicating examples of embodiments of the present disclosure, are given by way of illustration only and not by way of limitation. From this disclosure, various substitutions, modifications, additions rearrangements, or combinations thereof within the scope of the present disclosure may be made and will become apparent to those of ordinary skill in the art.

In accordance with common practice, the various features illustrated in the drawings may not be drawn to scale. The illustrations presented herein are not meant to be actual views of any particular method, device, or system, but are merely idealized representations that are employed to describe various embodiments of the present disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal for clarity of presentation and description. It should be understood by a person of ordinary skill in the art that the signal may represent a bus of signals, wherein the bus may have a variety of bit widths and the present disclosure may be implemented on any number of data signals including a single data signal.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise a set of elements may comprise one or more elements.

Elements described herein may include multiple instances of the same element. These elements may be generically indicated by a numerical designator (e.g. 110) and specifically indicated by the numerical indicator followed by an alphabetic designator (e.g., 110A) or a numeric indicator preceded by a "dash" (e.g., 110-1). For ease of following the description, for the most part, element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

When describing circuit elements, such as, for example, resistors, capacitors, and transistors, designators for the circuit elements begin with an element type designator (e.g., R, C, M) followed by a numeric indicator. Circuit element numbers may be repeated on different drawings and are not to be considered the same element unless expressly indicated as such. In other words, a capacitor C1 on FIG. 1 is a different element from a capacitor C1 on FIG. 6. Power sources such as, for example VDD and VCC as well as ground voltages may be generically indicated. When appropriate, these power signals may be described in detail. In other cases, the power signals may not be described as it would be apparent to a person of ordinary skill in the art which power signal should be used. As a non-limiting example, it may be appropriate to maintain separate analog and digital grounds and a person of ordinary skill in the art would understand which is the appropriate ground for a specific circuit.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

Embodiments of the present disclosure enhance the slew rate of an amplifier without affecting other small signal AC characteristics and DC characteristics of the amplifier. Embodiments of the present disclosure can be used to improve performance in any circuits that use differential amplifiers and operational amplifiers, particularly for when they are used in an error amplifier configuration and in circuits that have a feedback loop keeping the amplifier in the linear mode and steady state most of the time.

FIG. 1 illustrates a block diagram of a differential amplifier 120 with a slew rate enhancer 130. This discussion concentrates on a particular embodiment of an operational amplifier 120. However, embodiments of the present disclosure may be applied to a number of different configurations of operational amplifiers and differential amplifiers.

The operational amplifier 120 includes its typical terminals of a positive input 122 (also referred to herein as a first input 122), a negative input 124 (also referred to herein as a second input 124) and an output 126. The operational amplifier 120 also includes inputs for a first adjustment signal 132 and a second adjustment signal 134 from the slew rate enhancer 130. A bias generator 110 is shown as separate from the operational amplifier 120 for convenience in presenting the drawings. Depending on the implementation, the bias generator may be part of the operational amplifier 120, the slew rate enhancer 130, or separate.

From the bias generator 110, a number of bias signals 112 are provided to the operational amplifier 120 and the slew rate enhancer 130, as discussed below.

Figure 2:
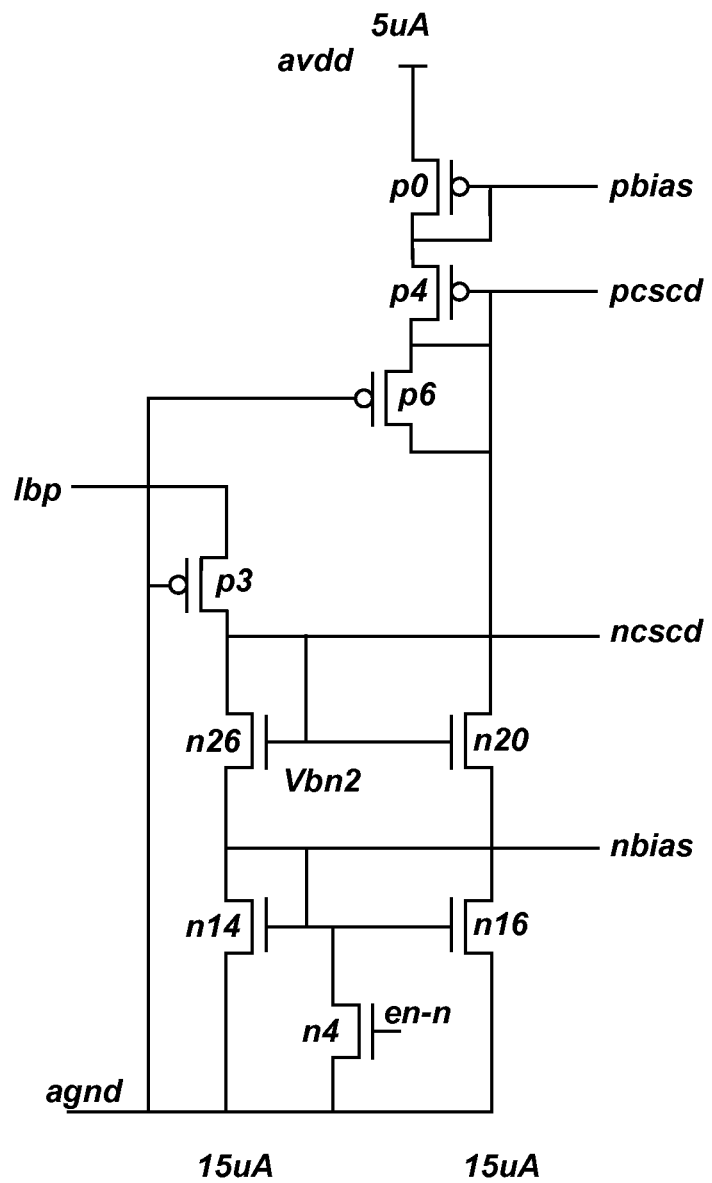
FIG. 2 is a circuit diagram of a bias circuit for creating various bias voltages for the differential amplifier and the slew rate enhancer of FIG. 3.

FIG. 2 is a circuit diagram of a bias circuit for creating various bias voltages for the operational amplifier 120 and the slew rate enhancer 130. The implementation of the bias generator is straightforward and need not be discussed in detail except to say that it provides a pbias signal, an nbias signal a pcscd signal (a bias signal for p-channel cascode configured transistors) and an ncscd signal (a bias signal for n-channel cascode configured transistors).

Figure 3:
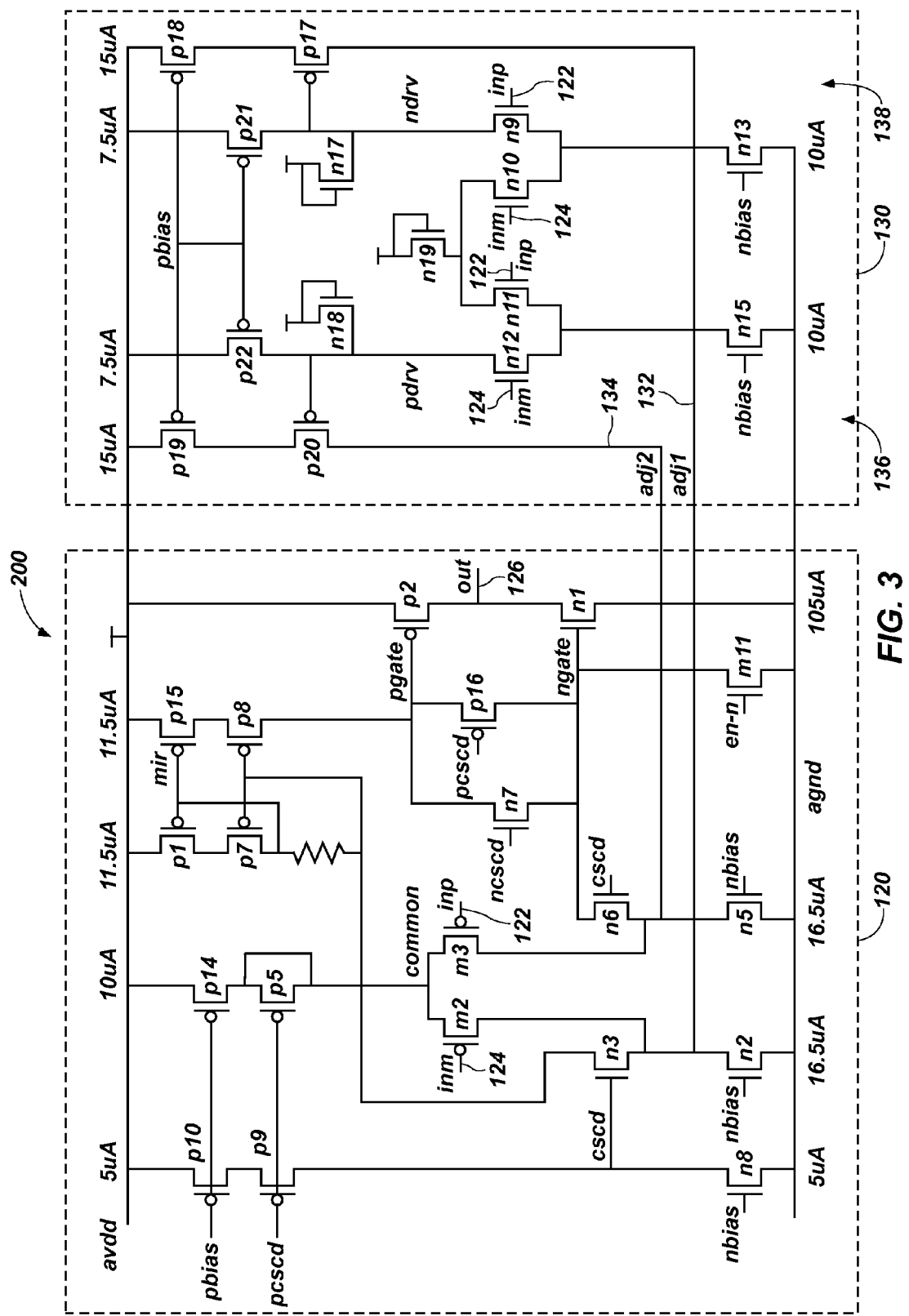
FIG. 3 is a circuit diagram illustrating details of the differential amplifier and the slew rate enhancer of FIG. 1.

FIG. 3 is a circuit diagram illustrating details of the operational amplifier 120 and the slew rate enhancer 130 of FIG. 1. The embodiments discussed herein do not change existing amplifier circuits except to include two taps into the circuit where the slew rate enhancements are made. These two taps are the first adjustment signal 132 and the second adjustment signal 134. Moreover, when the amplifier is in a substantially steady state, the slew rate enhancement is essentially shut off so that it does not affect the small signal performance of the amplifier. However, when in slew mode, where the differential inputs of the amplifier are far apart, the slew rate enhancer is activated to provide additional tail current to one side of a differential pair of the amplifier to make the slew rate faster. When the differential inputs return close together, the slew rate enhancer shuts off again.

The operational amplifier 120 includes an amplifier differential input pair m2 and m3 as p-channel transistors with a common source. The gate of transistor m2 is coupled to the negative input 124 and the gate of transistor m3 is coupled to the positive input 122. Current is supplied to the common source from transistors p14 and p5 that are biased to supply about 10 µA in this example. The currents defined in this example are to aid in explanation of the circuit. Many other suitable circuits and currents may be used for other embodiments.

A tail current for transistor m2 is provided at least by transistor n2 biased to provide about 16.5 µA. A tail current for transistor m3 is provided at least by transistor n5 biased to provide about 16.5 µA.

A common cascode bias signal (cscd) is generated by transistors p10, p9, and n8. The common cascode bias signal (cscd) is used to bias cascode configured transistors n3 and n6. A current source of about 11.5 µA is provided by transistors p1 and p7 through a resistor and transistor n3, which is controlled by the common cascode bias signal (cscd). A current mirror including transistors p15 and p8 mirrors the current of about 11.5 μA to drive a pgate signal. Transistors p16 and n7 are controlled by a p-cascode bias signal (pcscd) and a n-cascode bias signal (ncscd), respectively. Transistors p16 and n7 provide a pass-gate configuration between the pgate signal and an ngate signal. Transistor m11 is controlled by an enable signal (en-n) to control enabling and disabling of the operational amplifier 120.

The output 126 of the operational amplifier 120, which is configured to provide about 105 μA, is driven on the high-side by output transistor p2 controlled by the pgate signal and on the low-side by output transistor n1 controlled by the ngate signal. Other operations and functions of the transistors of the operational amplifier 120 are straightforward and need not be described in detail to show the functions of the slew rate enhancer 130.

The slew rate enhancer 130 includes two separate differential input pairs. A first pair included transistor n9 and transistor n10. A second pair includes transistor n12 and transistor n11. The first differential pair n9/n10 form the basis of a first slew direction enhancer 136 including the transistors within the slew rate enhancer 130 to the right of transistor n19. The second differential pair n11/n12 form the basis of a second slew direction enhancer 138 including the transistors within the slew rate enhancer 130 to the left of transistor n19.

Beginning with a description of the first differential pair n9/n10, the pair has a common source coupled to transistor n13 biased for about 10 μA. The drain of transistor n9 is coupled to transistor p21 biased for about 7.5 μA. The drain of transistor n10 is coupled to clamping transistor n19.

The second differential pair n11/n12 is similarly configured with a common source coupled to transistor n15 biased for about 10 μA. The drain of transistor n12 coupled to transistor p22 biased for about 7.5 μA. The drain of transistor n11 is also coupled to clamping transistor n19.

In the amplifier differential pair m2/m3, the transistors are closely matched such that when in a steady state where the voltages of the positive input 122 and the negative input 124 are the same, the currents through transistors m2 and m3 will be substantially equal.

In contrast, in the slew rate enhancer 130 the first differential pair n9/n10 and the second differential pair n11/n12 are configured to be slightly offset such that one transistor is favored by making its channel length slightly smaller than the other one. Of course, this inherent offset could by created by modifying the widths of the transistors or other parameters rather than, or in combination with, modifying the channel lengths. However, adjusting the length may result in a smaller layout.

For the first differential pair n9/n10, transistor n9 is favored with a slightly smaller gate length relative to that of transistor n10. If the first differential pair n9/n10 were equally sized, the 10 μA tail current from transistor n13 would be equally split between transistor n9 and transistor n10 when the voltages of the positive input 122 and the negative input 124 are substantially equal. However, because of the difference in gate lengths, transistor n10 will conduct more than half the current from transistor n13 and transistor n9 will conduct less than half the current.

Slew mode happens in the operational amplifier 120 when one input gets so much larger than the other that the tail current goes primarily into one side of the amplifier differential pair m2/m3 and the other side gets little or no current. This can happen in one direction or the other (positive or negative) depending on the voltages of the inputs 122 and 124. In normal operation, slew mode is a transitional mode when there is a large miss-match between the voltages of the inputs 122 and 124, and after the transitional mode the operational amplifier 120 will return to a steady-state mode where the voltages of the inputs 122 and 124 and very close together.

The slew rate enhancer 130 is configured to detect this miss-match condition and provide additional current to the operational amplifier 120 to increase the slew rate.

Returning to the first differential pair n9/n10, the inputs are the same as for the amplifier differential pair m2/m3, so the first differential pair n9/n10 will behave similarly, except that it has an inherent offset. With the inherent offset, the first differential pair n9/n10 will detect the slew rate condition slightly later than the amplifier differential pair m2/m3. With this slight delay, it is certain that the operational amplifier 120 is fully in slew rate before current assistance is provided by the slew rate enhancer 130. As a result, the slew rate enhancer 130 does not turn on prematurely when the operational amplifier 120 does not need the current assistance.

In steady state mode, transistor p21 is biased to provide about 7.5 μA to transistor n9. Transistors n9 and n10 are sized such that about ⅔ of the 10 μA tail current flows through transistor n10 and ⅓ of the 10 μA tail current flows through transistor n9. As a result, the node ndrv is going to be pulled high and transistor p17 will be shut off. Therefore, there will be no current in the first adjustment signal 132 and it will not influence operation of the operational amplifier 120.

In slew mode (also referred to as a first slew rate condition), when the first input 122 has moved high enough relative to the second input 124, transistor n9 will begin to take more of the 10 μA tail current from transistor n13 and transistor n10 will take less. Once the current in transistor n9 gets above the 7.5 μA current from transistor p21, the node ndrv will go low, which will turn on transistor P17 so that it can provide the current set by transistor p18 (15 μA). As a result, the first adjustment signal 132 will be able to provide additional current to a first side of the amplifier differential pair m2/m3 at the drain of transistor n2, which will cause the transition time in a first direction on the output of the operational amplifier 120 to be faster.

Turning to the second differential pair n11/n12, this pair is similar to the first differential pair n9/n10 except that it has an inherent offset in the opposite direction. In other words, in steady state mode transistors n11 and n12 are sized such that about ⅔ of the 10 μA tail current flows through transistor n11 and ⅓ of the 10 μA tail current flows through transistor n12. As a result, the node pdrv is going to be pulled high and transistor p20 will be shut off. Therefore, there will be no current in the second adjustment signal 134 and it will not influence operation of the operational amplifier 120.

In slew mode (also referred to as a second slew rate condition), when the first input 122 has moved high enough relative to the second input 12, transistor n12 will begin to take more of the 10 μA tail current from transistor n15 and transistor n11 will take less. Once the current in transistor n12 gets above the 7.5 μA current from transistor p22, the node pdrv will go low, which will turn on transistor P20 so that it can provide the current set by transistor p19 (15 μA). As a result, the second adjustment signal 134 will be able to provide additional current to a second side of the amplifier differential pair m2/m3 at the drain of transistor n5, which will cause the transition time in a second direction on the output of the operational amplifier 120 to be faster.

Transistors n18, n19, and n17 are configured as clamp circuits to hold the pdrv signal, the ndrv signal, and the drains of transistors n10 and n11 at a threshold voltage below Vdd when in the slew mode. This clamping enables the clamped nodes to have a smaller voltage swing so they can operate faster.

It should be noted that the level of slew rate enhancement may be made programmable simply by varying the sizes of current source transistors p19 and p18 to provide more or less current during the slew phase.

Embodiments of the present disclosure may be useful in many circuits that use differential amplifiers and operational amplifiers in an error amplifier configuration. Particularly in circuits that have a feedback loop that generally keeps the amplifier in the linear mode and at a substantially steady state.

While in slew mode, the loop may be unstable and so reducing the time in slew mode with embodiments of the present disclosure may keep the loop more stable and in the non-linear mode for a shorter time period.

Figure 4:
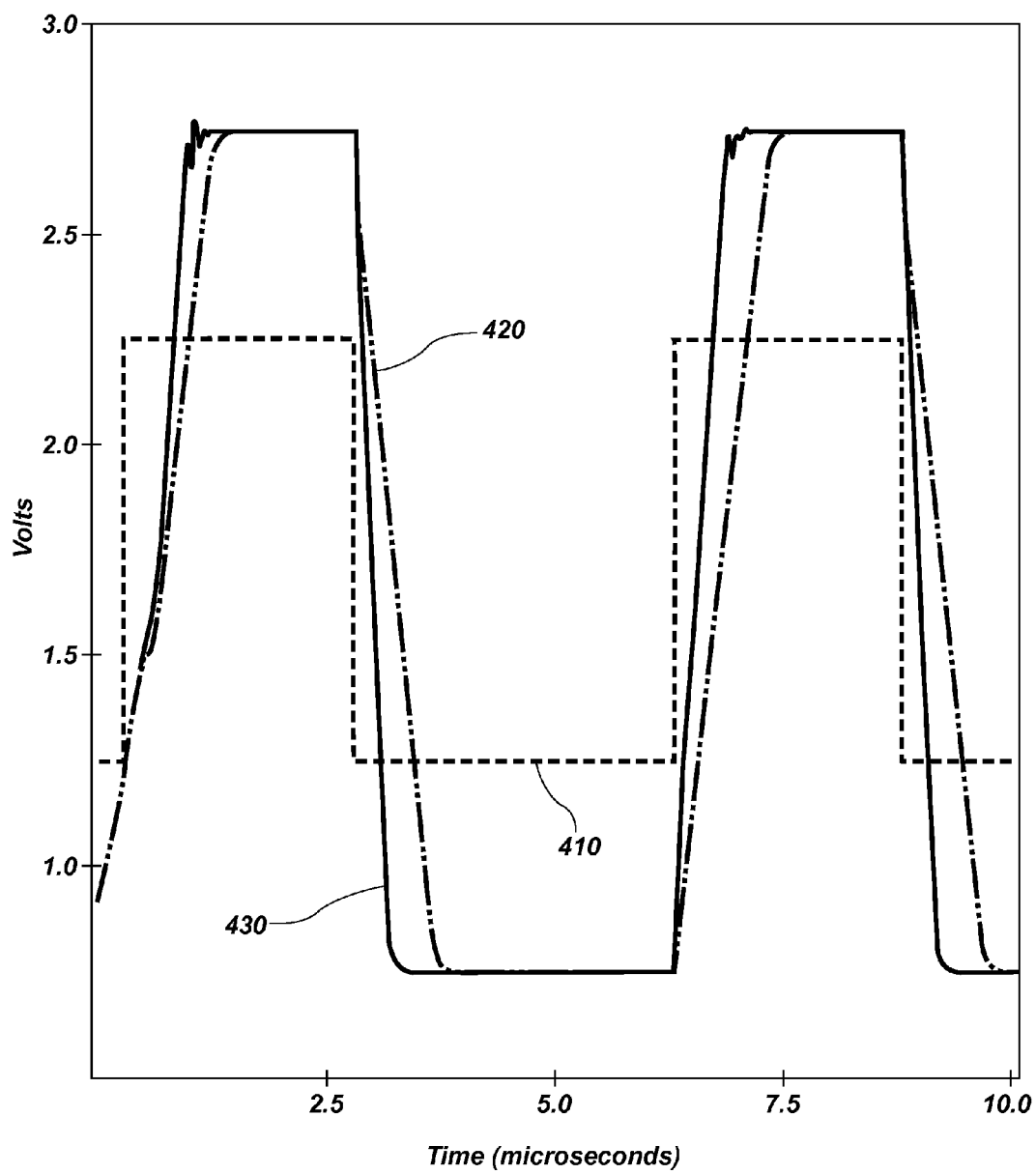
FIG. 4 is a simulation result showing the improvement in slew rate according to embodiments of the present disclosure.

FIG. 4 is a simulation result showing the improvement in slew rate according to embodiments of the present disclosure. Curve 410 shows the input signal difference between inputs inp and inm. Curve 420 shows the slew rate on the output of the operational amplifier 120 without the slew rate enhancer 130 connected. Curve 430 shows the slew rate on the output of the operational amplifier 120 with the slew rate enhancer 130. As can be seen, the slew rate has been improved significantly due to the inclusion of the slew rate enhancer 130.

While the present invention has been described herein with respect to certain preferred embodiments, those of ordinary skill in the art will recognize and appreciate that it is not so limited. Rather, many additions, deletions, and modifications to the preferred embodiments may be made without departing from the scope of the invention as hereinafter claimed. In addition, features from one embodiment may be combined with features of another embodiment while still being encompassed within the scope of the invention as contemplated by the inventors.

What is claimed is:

1. A circuit to enhance slew rate, comprising:
    an amplifier comprising a positive input operably coupled to a first side of an amplifier differential pair, a negative input operably coupled to a second side of the amplifier differential pair, and an output;
    a first slew direction enhancer comprising a first differential pair, wherein the first differential pair has a first transistor and a second transistor, is operably coupled to the positive input and the negative input is configured to cause the first slew direction enhancer to provide additional current for the first side of the amplifier differential pair during an offset in a first direction between the positive input and the negative input, and wherein a gate length of the first transistor is shorter than a gate length of the second transistor to detect the offset in the first direction after the amplifier differential pair detects the offset in the first direction; and
    a second slew direction enhancer comprising a second differential pair operably coupled to the positive input and the negative input, wherein the second differential pair is configured to cause the second slew direction enhancer to provide additional current for the second side of the amplifier differential pair during an offset in a second direction between the positive input and the negative input.

2. The circuit of claim 1, wherein the second differential pair includes transistor sizes skewed to detect the offset in the second direction after the amplifier differential pair detects the offset in the second direction.

3. The circuit of claim 2, wherein a gate length of a first transistor of the second differential pair is shorter than a gate length of a second transistor of the second differential pair to create a skew in the transistor sizes.

4. The circuit of claim 1, wherein the first slew direction enhancer further comprises:
    a first control node operably coupled to one transistor of the first differential pair and configured to go to a low voltage during the offset in the first direction; and
    a first pull-up transistor configured to provide the additional current for the first side of the amplifier differential pair responsive to the low voltage on the first control node.

5. The circuit of claim 4, wherein the first slew direction enhancer further comprises a second pull-up transistor configured to pull the first control node to a high voltage when the offset in the first direction is not present such that the first pull-up transistor will be shut off.

6. The circuit of claim 1, wherein the second slew direction enhancer further comprises:
    a first control node operably coupled to one transistor of the second differential pair and configured to go to a low voltage during the offset in the second direction; and
    a first pull-up transistor configured to provide the additional current for the second side of the amplifier differential pair responsive to the low voltage on the first control node.

7. The circuit of claim 6, wherein the second slew direction enhancer further comprises a second pull-up transistor configured to pull the first control node to a high voltage when the offset in the second direction is not present such that the first pull-up transistor will be shut off.

8. A circuit to enhance slew rate, comprising:
    an amplifier comprising a first input and a second input in a differential pair configuration and an output, the differential pair configuration having a first side and a second side;
    a slew rate enhancer comprising:
        a first slew direction enhancer configured to:
            detect a first slew rate condition in a first direction responsive to the first input and the second input; and
            provide additional current for the first side of the differential pair configuration of the amplifier during the first slew rate condition using a first pull-up transistor, the first pull-up transistor configured to supply an adjustment signal in response to a low voltage;
        a second slew direction enhancer configured to:
            detect a second slew rate condition in a second direction responsive to the first input and the second input; and
            provide additional current for a second side of the differential pair configuration of the amplifier during the second slew rate condition.

9. The circuit of claim 8, wherein the first slew direction enhancer is further configured to provide the additional current for the first side of the differential pair configuration of the amplifier after the first slew rate condition commences.

10. The circuit of claim 9, wherein the first slew direction enhancer is further configured to detect a steady-state condition between the first input and the second input and prevent the additional current for the first side of the differential pair configuration of the amplifier during the steady-state condition.

11. The circuit of claim 8, wherein the second slew direction enhancer is further configured to provide the additional current for the second side of the differential pair configuration of the amplifier after the second slew rate condition commences.

12. The circuit of claim 11, wherein the second slew direction enhancer is further configured to detect a steady-state condition between the first input and the second input and prevent the additional current for the second side of the differential pair configuration of the amplifier during the steady-state condition.

13. The circuit of claim 8, wherein the first slew direction enhancer further comprises:
a first control node operably coupled to a first transistor of the first slew direction enhancer and configured to go to a low voltage during the first slew rate condition; and
further wherein the second slew direction enhancer further comprises:
a second control node operably coupled to a first transistor of the second slew direction enhancer and configured to go to a low voltage during the second slew rate condition; and
a second pull-up transistor configured to provide the additional current for the second side of the differential pair configuration of the amplifier responsive to the low voltage on the second control node.

14. The circuit of claim 8, wherein the first slew direction enhancer includes a first transistor and a second transistor wherein a gate length of the first transistor is shorter than a gate length of the second transistor.

15. A method of enhancing slew rate, comprising:
detecting a first slew rate condition responsive to a first offset in a first direction between a first input and a second input using a first differential pair;
providing additional current for a first side of a differential pair of an amplifier coupled to the first input and the second input during the first slew rate condition using a first pull-up transistor, the first pull-up transistor configured to supply an adjustment signal in response to a low voltage;

detecting a second slew rate condition responsive to a second offset in a second direction between the first input and the second input using a second differential pair; and
providing additional current for a second side of the differential pair of the amplifier during the second slew rate condition.

16. The method of claim 15, wherein detecting the first slew rate condition further comprises detecting the first slew rate condition after the differential pair of the amplifier detects the first slew rate condition.

17. The method of claim 16, further comprising detecting a steady-state condition between the first input and the second input and preventing the additional current for the first side of the differential pair of the amplifier during the steady-state condition.

18. The method of claim 15, wherein detecting the second slew rate condition further comprises detecting the second slew rate condition after the differential pair of the amplifier detects the second slew rate condition.

19. The method of claim 18, further comprising detecting a steady-state condition between the first input and the second input and preventing the additional current for the second side of the differential pair of the amplifier during the steady-state condition.

20. The method of claim 15, wherein providing additional current for the first side of the differential pair of the amplifier comprises:
responding with additional current for the first side of the differential pair of the amplifier using the first pull-up transistor when a first control node is at a low voltage; and
further wherein providing additional current for the second side of the differential pair of the amplifier comprises:
responding with additional current for the second side of the differential pair of the amplifier using a second pull-up transistor when a second control node is at a low voltage.

* * * * *